United States Patent [19]

Landis

[11] Patent Number: 4,608,451
[45] Date of Patent: Aug. 26, 1986

[54] CROSS-GROOVED SOLAR CELL
[75] Inventor: Geoffrey A. Landis, Providence, R.I.
[73] Assignee: Spire Corporation, Bedford, Mass.
[21] Appl. No.: 619,225
[22] Filed: Jun. 11, 1984
[51] Int. Cl.[4] .............................................. H01L 31/06
[52] U.S. Cl. ................................... 136/256; 136/259; 357/30; 357/55
[58] Field of Search ....................... 136/255, 256, 259; 357/30, 55

[56] References Cited

U.S. PATENT DOCUMENTS

| | | | |
|---|---|---|---|
| 3,487,223 | 12/1969 | St. John | 250/216 |
| 3,673,468 | 6/1972 | Schafer | 357/49 |
| 4,029,962 | 6/1977 | Chapman | 250/338 |
| 4,135,950 | 1/1979 | Rittner | 136/255 |
| 4,360,701 | 11/1982 | Evans, Jr. | 136/259 |
| 4,379,944 | 4/1983 | Borden et al. | 136/259 |
| 4,453,030 | 6/1984 | David et al. | 136/256 |

OTHER PUBLICATIONS

G. A. Brooks et al, *IBM Tech. Disc. Bull.*, vol. 22, p. 1449 (1979).
D. Redfield, "Multiple-Pass Thin-Film Silicon Solar Cell," *Applied Physics Letters*, vol. 25, No. 11 (Dec. 1, 1974), pp. 647–648.
M. Spitzer et al, "Ultra High Efficiency Thin Silicon P-N Junction Solar Cells Using Reflecting Surfaces," 1980 *IEEE Photovoltaic Specialists Conf.*, pp. 375–380.
E. Yablonovitch et al, "Intensity Enhancement ... ," *IEEE Trans. on Electron Dev.*, vol. Ed-29, No. 2 (Feb. 1982), pp. 300–305.
J. Muller, "Thin Silicon Film p-i-n Photodiodes ... ," *IEEE Trans. on Electron Dev.*, vol. Ed-25, No. 2, (Feb. 1978), pp. 247–253.

*Primary Examiner*—Aaron Weisstuch

[57] ABSTRACT

A solar cell of improved conversion efficiency and a process of making it are disclosed. The solar cell is designed to trap incident light within the cell by multiple internal reflections and thus increases the absorption of light in the cell. The solar cell is formed with a plurality of spaced parallel grooves on both the front and the back surfaces. The direction of the grooves on the front surface is at an angle with respect to the direction of the grooves on the back surface.

7 Claims, 6 Drawing Figures

CROSS-GROOVED SOLAR CELL

BACKGROUND OF THE INVENTION

1. Field of the Invention

The present invention relates generally to solar cells and, more particularly, to a solar cell of improved conversion efficiency and formed with a plurality of grooves on its surfaces where the direction of the front grooves is at an angle to the direction of the back grooves.

2. The Prior Art

Solar cells are pn-junction devices which convert incident light energy directly into electrical energy. Solar cells are widely known but not yet widely used. Their use has been restricted by competitive economics, specifically their lack of ability to compete in the marketplace with other known sources of electrical energy. At the heart of this is the relatively low conversion efficiencies of most solar cells, typically in the 10-14% range, with only the best and the most expensive solar cells reaching efficiencies of about 17-18%.

As known, for solar cells with low surface recombination at their back surfaces, the open circuit voltage ($V_{oc}$), hence efficiency, increases as the wafer thickness decreases. As the solar cell is made thinner, however, the short circuit current ($I_{sc}$) decreases. This is so because not all of the incident light striking the solar cell is absorbed in the reduced optical path length (L) between the front and the back surfaces. In order to maintain light absorption at optimum level without at the same time increasing the thickness of the cell, it is desirable therefore to increase the optical path length (L) of the light traveling within the solar cell.

The desirability of increasing the optical path length (L) in solar cells has been recognized for some time. In a simple cell, light simply passes through the cell once, hence its optical path length (L) equals the cell's thickness, i.e., $L=1$. By adding a back surface reflector (BSR) to the back surface of the cell, its optical path length is doubled (the light passing through twice the cell), i.e., $L=2$. By also texturing the front surface of the cell, together with the BSR, the optical path length is increased to about 2.5 times the thickness of the cell, i.e., $L=2.5$. On silicon cells, texturization is usually accomplished with an anisotropic etching medium, such as an alkali hydroxide solution, often sodium hydroxide or potassium hydroxide solution. Rather than texturing the front surface, the back surface may be textured. The angle of back texturization must be greater than $\theta/2$, where $\theta = \arcsin(n_2/n_1)$, and $n_2$ is the index of refraction of the solar cell material and $n_1$ is the index of refraction of the external medium, such as air, where $n_1$ equals about one. For a silicon solar cell, $n_2$ is about 3.7, varying slightly with wavelength. Light entering through the front surface first is reflected back at an angle by the textured back surface toward the front surface. If the angle of incidence of light striking the inside front surface is greater than $\theta$, it will be reflected back again at an angle toward the textured back surface. The textured back surface then reflects the light so that it now exits through the front surface. The light thus makes two passes in each direction, two of those being at an angle, before exiting from the cell. The resultant optical path length is about 4.6, i.e., $L=4.6$.

Attempts at texturing both the front and the back surfaces, however, tended to shorten rather than lengthen this optical path length. This is due to the fact that light entering through one facet in the front surface most likely will reflect from a facet parallel to the first facet, resulting in only one light pass in each direction. Thus, the optical path length is about the same as that of the front textured cell, i.e., $L=2.5$.

Some workers in the art have suggested more sophisticated back texturing, namely texturing at very low angles. See D. Redfield, *Applied Physics Letters,* Vol. 25, No. 11 (1 Dec. 1974), pp. 647-648; and M. B. Spitzer et al., *Proceedings 13th IEEE Phtovoltaic Specialists Conference* (1980), p. 375. In this case, the optical path length depends on the exact sequence of reflections taken by the incident light, which is a function of the position of the entering light ray. For the most probable sequence of reflections, four passes throught the solar cell are made in each direction, resulting in an optical path length of about 11.4 times the thickness of the cell, i.e., $L=11.4$. Such an optical path length enhancement, however, requires a flat front surface, which has a higher reflectivity than a textured surface. Furthermore, if the back surface low angle texturing is produced by anisotropic etching, the process requires the employment of an unusual, hence costly, material orientation.

Other workers in the art (see E. Yablonovitch and G. D. Cody, *IEEE Transactions on Electron Devices,* Vol. ED-29, No. 2, February 1982, pp. 300-305) have investigated optical path length increase in solar cells by employing arbitarily rough back surfaces. With the use of arbitarily rough back surfaces, the direction of the light rays is assumed to be completely randomized by each reflection. Theoretically at least, such complete randomization results in a maximum achievable total optical path length enhancement of $4(n_2/n_1)^2$, where $(n_2/n_1)^2$ represents enhancement due to total internal reflection at the cell's front surface, and times 2 due to total reflection by a BSR and the other times 2 due to the obliqueness of the angles of the light rays traversing the body of the solar cell. However, this theoretical maximum enhancement is achievable only if both cell surfaces are totally random in light reflection and if the randomness on the opposing surfaces are not correlated. The first of these can at best be approximated and the second improved, as for instance, by sandblasting, see U.S. Pat. No. 3,487,223 issued to A. E. St. John. When using sandblasting on the back surfaces of solar cells, damage to the surfaces occasioned by sandblasting can adversely affect cell performance.

SUMMARY OF THE INVENTION

It is a principal object of the present invention to overcome the above disadvantages by providing a solar cell of improved conversion efficiency and a process of making it.

More specifically, it is an object of the present invention to provide a solar cell having improved conversion efficiency due to nearly ideal optical path length enhancement comprising a thin semi-conductor wafer having nearly parallel front and back surfaces, wherein both surfaces are provided with a plurality of spaced parallel grooves, and wherein the direction of the front grooves is at an angle to the direction of the back grooves. Preferably, this angle is at least about 30°, and preferably is about 90°. Preferably, the grooves are V-shaped in right cross section. Preferably, the sides of the grooves form an angle to each other which is greater than about 30° but not in excess of 120° and preferably is about 70.5°. Preferably, the thin semiconductor wafer is formed of a single crystal semiconductor, such as single crystal silicon.

Other objects of the present invention will in part be obvious and will in part appear hereinafter.

The invention accordingly comprises the solar cell of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accomnpanying drawings, wherein.

DETAILED DESCRIPTION OF THE PREFERRED EMBODIMENTS

Figure 1:
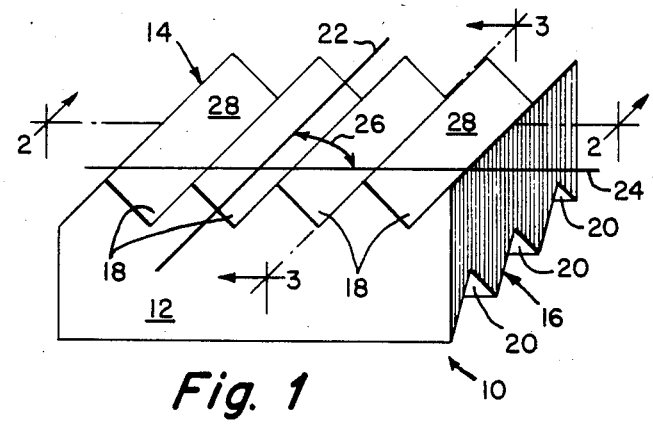
FIG. 1 is a schematic perspective view, on an enlarged scale, of a representative segment of a solar cell constructed in accordance with the present invention.

In general, a first illustrated embodiment of a solar cell 10 of improved conversion efficiency and constructed in accordance with the invention is depicted in schematic prespective in FIG. 1. The solar cell 10 is designed to trap incident light within the cell by multiple internal reflections, increasing thereby the absorption of light in the cell 10. These multiple internal reflections allow for either greater light absorption in a cell of a given thickness or a thinner cell of the same absorption, resulting in increased conversion efficiency in either event. It should be noted that, in addition to increased efficiency brought about by thin cells, there are other and further reasons making these solar cells desirable. These further reasons include a reduction in weight of the resultant solar battery in applications where high power-to-weight ratios are important; a reduction in wafer material usage in applications where material costs may be high; and an increase in radiation tolerance of the particular solar cell by shortening the distance to be traversed by the charge carriers within the cell before they are collected. One salient feature of the invention includes the employment of an advantageous unique geometrical configuration for the solar cell 10, as now more fully described.

Figure 2:
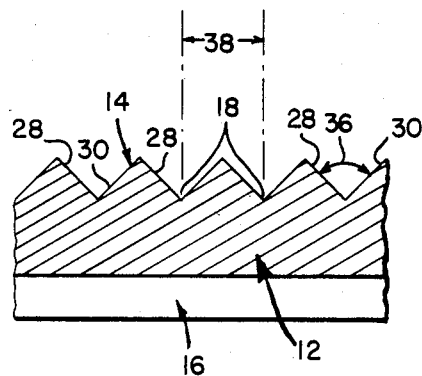
FIG. 2 is a cross section of the solar cell of FIG. 1 along the lines 2—2.
Figure 3:
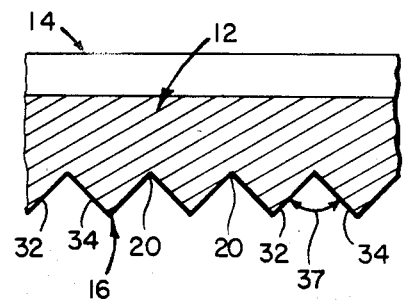
FIG. 3 is a cross section of the solar cell of FIG. 1 along the lines 3—3.

With particular reference to FIGS. 1–3, the representative segment of the solar cell 10 made according to the invention comprises a thin semi-conductor wafer 12 having a front surface 14 and a back surface 16. For best results and in order to take full advantage of the features of the invention, the thickness of the semi-conductor wafer 12 as measured between its surfaces 14 and 16 is not to exceed fifty microns or be less than five microns, and preferably be in the range of about twenty to forty microns. As clearly evident from the drawings, both the front surface 14 and the back surface 16 of the wafer 12 are provided with a plurality of spaced parallel grooves 18 and 20, respectively. It will be appreciated that in the drawings, the grooves 18 in the front surface 14 lie in a direction as exemplified by a line 22, and the grooves 20 in the back surface 16 lie in a direction as exemplified by a line 24, which is at an angle 26 normal to the direction of the line 22. However, this need not be case. The angle 26 can be as low as about 10° and as high as 120° and, of course, any desired angle therebetween.

Each of the plurality of spaced paralled grooves 18 and 20 is V-shaped in right cross section and is bounded by substantially flat sides 28, 30 and 32, 34, respectively. These flat sides 28, 30 of grooves 18 define an angle 36 therebetween, and the flat sides 32, 34 of the grooves 20 define an angle 37 therebetween. Again, for best results and in order to take full advantage of the features of the invention, these angles 36 and 37 need not be right angles, as illustrated. Rather, the angles 36 and 37 can be anywhere from about 30° to about 120°. For, with the angle 36 under 120°, some of the light rays reflected by the side 28 are going to be collected by the other side 30. And if the angle 36 is less than 90°, all of the light rays reflected by the side 28 are going to fall on the other side 30. For angles 36 under 90°, two or more reflections can occur between adjacent sides 28 and 30 of a particular V-shaped groove. Such multiple reflections occurring between adjacent sides of the plurality of grooves 18 and 20 considerably decrease the reflection loss of the solar cell 10.

The plurality of parallel grooves 18 and 20 are equidistantly spaced one from the other. Spacing between adjacent grooves 18 and 20 can be measured between adjacent peaks or between adjacent valleys, as illustrated in FIG. 2 by an arrow 38. While it is important that this spacing as illustrated by the length of the arrow 38 be less than the particular thickness of the thin semiconductor wafer 12, the spacing can vary anywhere from about two to about thirty microns, with a groove-spacing of from about ten to about twenty-five microns being preferred. As will be appreciated by those skilled in the art, the optimum thickness and spacing for a particular solar cell 10 are a function of the diffusion length and of the surface recombination in the particular material employed for forming the thin semi-conductor wafer 12 of the cell 10. The spacing selected for the front grooves 18 need not be identical to the spacing set for the back grooves 20.

Figure 4:
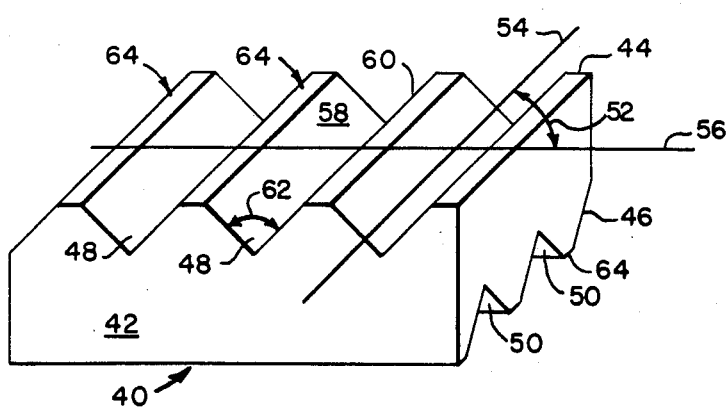
FIG. 4 is a schematic prespective view, also on an enlarged scale, of a representative segment of a second embodiment of a solar cell constructed in accordance with the present invention.

In FIG. 4. there is shown an alternate embodiment of a representative segment of a solar cell 40 constructed in accordance with the present invention. Solar cell 40 also comprises a thin semiconductor wafer 42 having a front surface 44 and a back surface 46. The dimensions of the solar cell 40 are the same as described with reference to the solar cell 10. Further, just as regards the cell 10, the solar cell 40 also is provided with a plurality of front and back spaced parallel grooves 48 and 50. The directions of these parallel grooves 48 and 50 also are at an angle 52 as measured between the lines 54 and 56.

Figure 5:
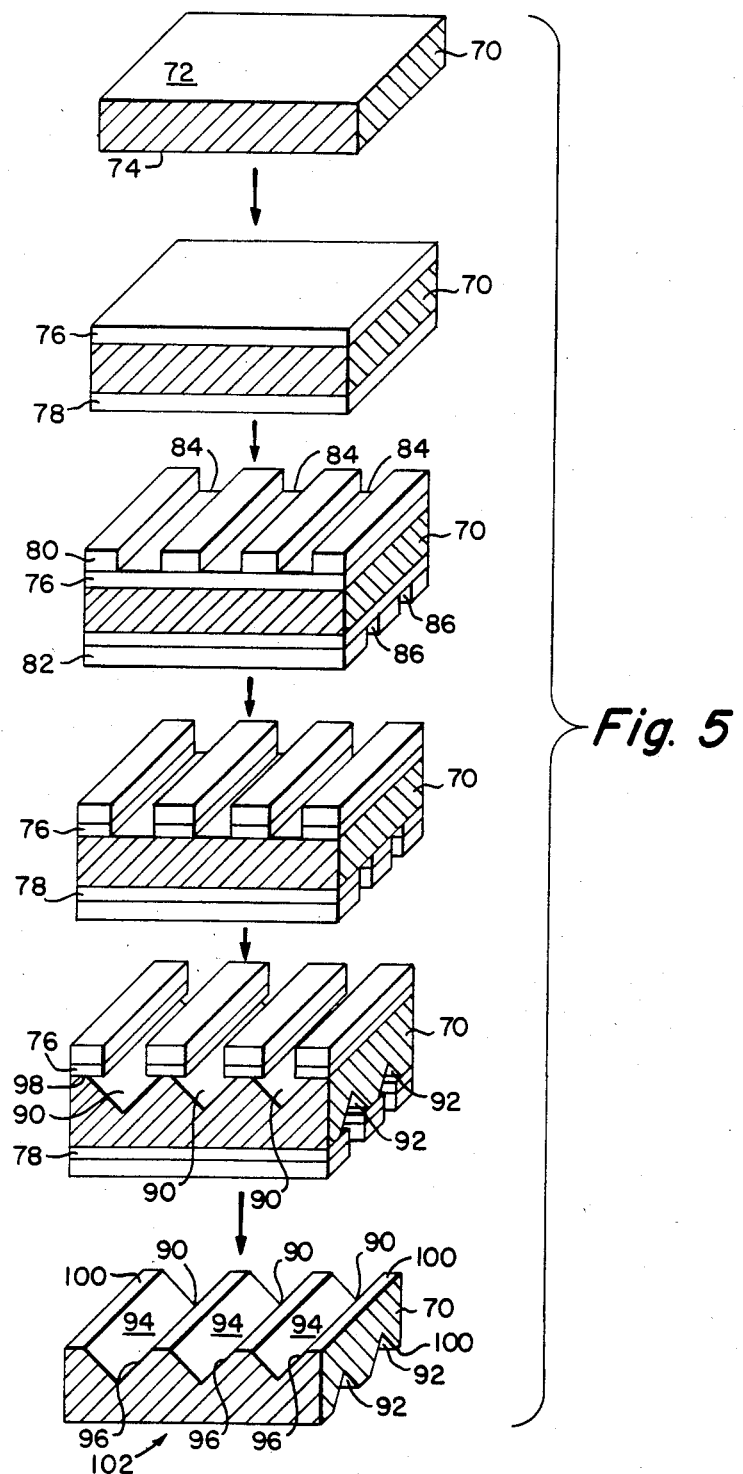
FIG. 5 is a flow diagram showing the several steps of practicing a process of the invention.

The size of the angle 52 is the same as described with reference to the angle 26 of the cell 10. The grooves 40 and 50 also are V-shaped in right cross section and are bounded by flat sides 58 and 60, defining an angle 62 there between. Again, the angle 62 is just like the angle 36 as regards size. Thus, the only difference between the solar cell 10 and the solar cell 40 is that the apex of the grooves 48 and 50 terminates in flat tops 64. These flat tops 64 occur primarily due to a preferred method of making the solar cell 40, as more fully described with reference to FIG. 5.

It must be pointed out that the principles of the invention are equally applicable to any and all semiconductor materials used to form the thin wafers 12 and 42. As those skilled in the art know full well, one of the best and most commonly used material for the thin wafers 12 and 42 is single crystal silicon material. If the solar cell 40 is to be made from a single crystal silicon material, the same preferably is made according to the process illustrated in FIG. 5. The process begins with the provision of a thin (100) oriented single crystal silicon wafer 70 having two flat opposed parallel surfaces 72 and 74. It is to be understood that the thickness of the silicon wafer 70 as measured between its opposed surfaces 72 and 74 is already selected to be that thickness as desired for the final product. Etch resistant layers 76 and 78 are then formed on the front and back surfaces 72 and 74 of the wafer 70. These layers 76 and 78 preferably are formed of silicon dioxide. A respective photoresist layer 80 and 82 is thereafter applied onto the etch resistant layers 76 and 78, preferably by being coated or sprayed thereon, using preferably an appropriately patterned mask, not shown. The purpose of using a patterned mask is to create a plurality of front and back spaced parallel slots 84 and 86 in the respective photoresist layers 80 and 82. The front slots 84 are at angle with respect to the direction of the back slots 86. More specifically, the front slots 84 are formed in a direction along the (110) crystallographic axes of the (100) orientation thin single crystal silicon wafer 70, and the back slots 86 are formed at an angle normal thereto. The spacing between the slots 84 and 86, which of course determines the spacing between the resultant grooves formed in the wafer 70, must be less than the particular thickness of the wafer 70. The dimensional considerations mentioned above with respect to the wafer 12 and 42 apply equally well here. Next, those portions of the etch resistant layers 76 and 78 immediately underlying the slots 84 and 86 are removed, prferably by hydrofluoric acid, with the remaining portions of the layers 76 and 78 serving as a mask for the next step in the process.

This next step involves the anisotropic etching of the exposed portions of the (100) orientation silicon wafer 70, preferably in an alkali hydroxide solution, such as potassium hydroxide. This anisotropic etching is responsible for producing a plurality of spaced parallel grooves 90 and 92 in the wafer 70. Each of these grooves 90 and 92 is bounded by a pair of the convergent planes 94 and 96. Due to the anisotropic etching of the exposed surfaces 72 and 74 of the (100) orientation single crystal silicon wafer 70, these convergent planes 94 and 96 will be formed along and consequently be bounded by the (111) crystallographic axes of the wafer 70. This results in a groove angle 36, 37 of about 70.5°. Preferably, the wafer 70 is etched until the grooves 90 and 92 are almost triangular at their respective apexes 98, leaving but narrow flat portions 100 on top. The remaining photoresist is then removed Further fabrication of the resultant solar cell 102, including junction formation, front and back metallization, are all effected by conventional techniques well known to those skilled in the art. These further fabrication steps thus form no part of the present invention.

Figure 6:
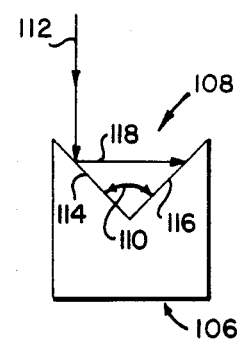
FIG. 6 is a schematic view illustrating certain principles helpful in understanding the invention.

In FIG. 6, there is depicted an enlarged schematic segment 106 of a solar cell constructed in accordance with the invention. This schematic segment 106 features a groove 108, cut at an angle 110, and one typical light ray 112 striking a side 114 and being reflected thereby to the other side 116, as at 118. As stated above, as long as the angle 110 is less than 120°, some of the incident light relected by the side 114 will strike upon and be collected by the other side 116. And whenever the angle 110 is less than or equal to 90°, all of the light reflected by the side 114 will strike upon and be collected by the side 116. It will be appreciated that reflections from one side of the groove 108 captured by the other side decrease the reflection loss of the solar cell 106.

Each of the illustrated and above described solar cells 10, 40, 102, and 106 is so textured by their respective grooves, formed at an angle 26, 52 between the two surfaces, as to achieve a nearly ideal path length (L) enhancement for the incoming light between these two surfaces. Internal reflection of light passing through the solar cells and off their respective back grooves 20 or 50 tends to direct the light obliquely toward the total internal reflection angle as presented by the repective front grooves 18 or 48. Because of the relative orientation of the front and the back grooves 18 and 20, the resultant texturization of these opposed surfaces are fully uncorrelated with respect to internal reflections occuring within the cells.

The combined effect achived by oblique penetration and internal reflection of incident light striking the front surface of the cell 10, 40, 102, made without a metallic back surface relector, will yield an average path length (L) increase of $2(n_2/n_1)^2$, where $n_2$ is the index of refraction of the solar cell material and $n_1$ is the index of refraction of the external medium, such as air. The path length increase (L) is about twice as great as above if the cell 10, 40 or 102 is made with a metallic back surface reflector. It should be noted, however, that in most instances, the front and back metallization of the cell is at least partly absorbing. Consequently, the theoretically maximum achievable path length enhancement, i.e., $4(n_2/n)^2$, can at best be appoximated and not achieved.

Thus it has been shown and described a cross-grooved solar cell of improved conversion efficiency, which solar cell satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A solar cell of improved conversion efficiency due to path length (L) enhancement of incident radiation comprising:
    (a) a thin semiconductor wafer having a front surface and an opposed back surface;
    (b) both said front surface and said back surface provided with a plurality of spaced parallel grooves;
    (c) the direction of said plurality of spaced parallel grooves provided on said front surface being at an angle with respect to the direction of said plurality of spaced parallel grooves provided on said back surface;
    (d) respective contacts provided on the opposed grooved surfaces and having a single continuous p-n junction between said opposed grooved surfaces;
    (e) said angle being at least about 10°;

(f) said thin semi-conductor wafer having a thickness from about five to about fifty microns;

(g) said plurality of spaced parallel grooves being formed
with a spacing of from about two to about thirty microns, said spacing being less than said thickness of said wafers;

(h) said plurality of opposed grooved surfaces effecting multiple internal reflections of said incident radiation within said solar cell.

2. The solar cell of claim 1 wherein said angle is at least about 10° and not greater than about 120°, and wherein said spacing between said plurality of spaced parallel groove on said front surface is the same as on said back surface.

3. The solar cell of claim 1 wherein each of said plurality of spaced parallel grooves is V-shaped in right cross section, wherein each of said V-shaped grooves defines an angle which is greater than about 30° but not greater than about 120°, wherein each of said V-shaped grooves is formed with a flat top at its apex, and wherein said spacing between said plurality of spaced parallel grooves on said front surface is different from said spacing on said back surface.

4. The solar cell of claim 1 wherein said thin semi-conductor wafer is formed of single crystal material, and wherein said path length (L) enhancement is $2(n_2/n_1)^2$, where $n_2$ is the index of refraction of said single crystal material and $n_1$ is the index of refraction of the medium surrounding said solar cell.

5. The solar cell of claim 1 wherein said thin semi-conductor wafer is formed of single crystal silicon.

6. The solar cell of claim 5 wherein said single crystal silicon wafer is a (100) oriented wafer, and wherein said plurality of spaced parallel grooves are bounded by low etch rate planes produced by anisotropic etching.

7. The solar cell of claim 5 wherein said plurality of spaced parallel grooves are bounded by (111) planes.

* * * * *